(12) United States Patent
Kim

(10) Patent No.: US 9,323,614 B2
(45) Date of Patent: Apr. 26, 2016

(54) DYNAMIC ERROR HANDLING FOR ON-CHIP MEMORY STRUCTURES

(71) Applicant: Wisconsin Alumni Research Foundation, Madison, WI (US)

(72) Inventor: Nam Sung Kim, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 239 days.

(21) Appl. No.: 14/073,336

(22) Filed: Nov. 6, 2013

(65) Prior Publication Data

US 2015/0128007 A1    May 7, 2015

(51) Int. Cl.
| G11C 29/00 | (2006.01) |
| G11C 7/00 | (2006.01) |
| G06F 11/10 | (2006.01) |
| G11C 5/14 | (2006.01) |
| G11C 29/52 | (2006.01) |
| G11C 29/04 | (2006.01) |

(52) U.S. Cl.
CPC ............ *G06F 11/1076* (2013.01); *G11C 5/147* (2013.01); *G11C 29/52* (2013.01); *G11C 2029/0409* (2013.01); *G11C 2029/0411* (2013.01)

(58) Field of Classification Search
CPC .... G06F 11/1076; G11C 5/147; G11C 29/52; G11C 2029/0409; G11C 2029/0411
USPC .......... 711/104, 105, 111, 100, 154; 713/323, 713/340, 300; 365/185.26, 185.01, 200, 365/201, 204; 714/763, 718, 721, 767, 769, 714/800
See application file for complete search history.

(56) References Cited

U.S. PATENT DOCUMENTS

| 6,434,668 | B1 | 8/2002 | Arimilli et al. | |
| 7,316,984 | B2 | 1/2008 | Higuchi et al. | |
| 7,606,976 | B2 | 10/2009 | Raghuvanshi | |
| 8,286,055 | B2 * | 10/2012 | Rho | G06F 11/1048 365/230.08 |
| 8,898,543 | B2 * | 11/2014 | Jo | G06F 11/1072 714/721 |
| 2005/0080994 | A1 | 4/2005 | Cohen et al. | |
| 2006/0136656 | A1 | 6/2006 | Conley et al. | |
| 2008/0040547 | A1 | 2/2008 | Abadeer et al. | |
| 2008/0091990 | A1 * | 4/2008 | Bruce | G11C 5/147 714/721 |
| 2009/0138658 | A1 | 5/2009 | Dreslinski, Jr. et al. | |
| 2010/0191990 | A1 | 7/2010 | Zhang et al. | |
| 2013/0094318 | A1 | 4/2013 | Kim et al. | |
| 2014/0281808 | A1 * | 9/2014 | Lam | G06F 11/1048 714/764 |

* cited by examiner

*Primary Examiner* — Christine Tu
(74) *Attorney, Agent, or Firm* — Boyle Fredrickson, S.C.

(57) ABSTRACT

A memory structure is provided that controls the activation of error handling bits as a function of operating voltage. In this way, error correction can be used to offset errors when the memory structure is run at low voltage (and frequency). However, negative performance impacts for such error correction, such as additional access latencies, can be avoided when the memory structure is run at higher voltage (and frequency) and memory errors are less likely. In addition, increased latencies due to evaluating error handling bits may be hidden by reading digital data bits from the memory structures speculatively and assuming no errors. Also, certain portions of memory structures may have larger cells, and therefore larger areas, than other portions, which may provide not only higher reliability at low operating voltages, but also faster operation with reduced latency.

20 Claims, 12 Drawing Sheets

C = CLEAN CACHE
D = DIRTY CACHE LINE
✖ = DEACTIVATED

DYNAMIC ERROR HANDLING FOR ON-CHIP MEMORY STRUCTURES

STATEMENT REGARDING FEDERALLY SPONSORED RESEARCH OR DEVELOPMENT

This invention was made with government support under 1016262 awarded by the National Science Foundation. The government has certain rights in the invention.

BACKGROUND OF THE INVENTION

The present invention relates to architectures for integrated circuits, and, in particular, to improved methods and apparatuses providing reliable and power conserving, low-voltage operation of memory structures.

Current computer architectures employ various types of memory structures, such as caches and static random access memories (SRAM); scratchpad memories, or high-speed internal memories used for temporary storage of calculations, data, and other work in progress; dynamic random access memories (DRAM); physical register files (PRF); branch target buffers (BTB); translation look-aside buffers (TLB); re-order buffers (ROB); instruction queues (IQ); load/store queues (LSQ); and so forth. These memory structures serve a variety of functions, including providing high speed local storage for processing elements that may help overcome relatively slower access speeds from other memory structures. Successful operation of the these memory structures takes advantage of the ability to predict likely future use of data by the processing element so that data required by the processing element may be pre-stored or retained in the memory structures to be quickly available when that data is needed.

Often multiple hierarchical memory structures are used with the smallest and fastest memory structure operating in coordination with successively larger and slower memory structures. For example, with respect to caches, a smaller and faster Level 1 (L1) cache may typically operate in coordination with successive larger and slower Level 2 (L2) and Level 3 (L3) caches or a Last Level Cache (LLC). Multiple levels of memory structures allow a flexible trade-off between speed of data access and the likelihood that the requested data will be in the memory structure. Memory structures are often managed by memory controllers which determine which portions of the memory should be ejected when new data is required.

With increased circuit density in integrated circuits, power efficiency has become a design priority for high performance and low-power processors and processing elements. The maximum speed of high-performance processors is often limited by problems of power dissipation which may be addressed by improving energy efficiency. For low-power processors, energy efficiency increases the operating time of the processor when operating on as battery power source.

An effective technique to increase processor efficiency is Dynamic Voltage and Frequency Scaling (DVFS) in which the processor voltage and processor clock speed are reduced at times of low processing demand. Reducing the processor voltage and frequency significantly lowers dynamic and static power consumption of transistors.

The minimum voltage (Vmin or $V_{DDMIN}$) that may be used with DVFS for memory structures is determined by the lowest voltage at which the transistor circuitry of the memory cells of the memory structure may maintain their logical state. Vmin may be reduced by increasing the size of the transistors in the memory cells of the memory structures. This makes the transistors less sensitive to mismatches induced by process variations such as random dopant fluctuations (RDF) and line edge roughness (LER) limits. Increasing the size of these transistors, however, is undesirable because memory structures typically occupy significant physical areas on integrated circuits.

Certain improvements are described in U.S. patent application Ser. No. 13/271,771, titled "Energy Efficient Processor Having Heterogeneous Cache," the contents of which are hereby incorporated by reference in its entirety. There is a continuing need for greater performance in such memory structures while simultaneous achieving power efficiency.

SUMMARY OF THE INVENTION

The present invention provides an improved on-chip memory structure that controls the activation of error handling bits as a function of operating voltage. In this way, error correction can be used to offset errors only when the memory structure is run at low voltage (and frequency). Consequently, negative performance impacts for evaluating error handling bits, such as additional access latencies, are avoided when the memory operates at higher voltage (and frequency) and memory errors are less likely.

In some embodiments, increased latencies due to evaluating error handling bits, such as correcting code (ECC) bits, redundant or backup memory bits, etc., may be hidden by reading digital data bits from memory structures speculatively and assuming no errors. Subsequently, in the background, the error handling bits may be evaluated for presence of errors in the digital data bits.

In some embodiments, certain portions of the memory structure may have larger cells, and therefore larger areas, than other portions. This, in turn, may provide not only higher reliability at low operating voltages, but also faster operation with reduced latency. As a result, for workloads or threads of execution not requiring as much resources or capacity, but preferring reduced access latency or cycle times at high voltage/frequency, the larger portions can be activated while the smaller portions are deactivated to improve performance.

Memory structures may include, for example, such as caches and static random access memories (SRAM); scratchpad memories, or high-speed internal memories used for temporary storage of calculations, data, and other work in progress; dynamic random access memories (DRAM); physical register files (PRF); branch target buffers (BTB); translation look-aside buffers (TLB); re-order buffers (ROB); instruction queues (IQ); load/store queues (LSQ); and so forth.

Accordingly, the invention may provide a memory system comprising a series of addressable transistor memory cells holding digital data when powered by an operating voltage. The addressable transistor memory cells may be grouped into at least two portions. Each portion may be adapted for storing digital data bits and error handling bits for evaluating presence of errors in the digital data bits of the respective portion. Error handling bits are evaluated for presence of errors in digital data bits of a respective portion when there is a reduction in operating voltage, and the error handling bits are not evaluated for presence of errors in the digital data bits in the respective portion when there is not a reduction in operating voltage.

It is thus a feature of at least one embodiment of the invention to correlate evaluation of error handling data with operating voltage, such that memory performance and data integrity may be optimized.

The portions may provide different architectures having different predetermined susceptibility to errors as a function of operating voltage, whereby individual portions may be deactivated or activated with changes in operating voltage according to the predetermined susceptibility to errors as a function of operating voltage.

It is thus a feature of at least one embodiment of the invention to vary the architecture of the memory structure to allow lower voltage operation of at least a portion of the memory structure and thereby rendering a flexible trade-off between memory capacity and the ability to conserve power.

The portions having lower susceptibility to errors as a function of operating voltage may store greater amounts of error handling bits than portions having higher susceptibility to errors as a function of operating voltage.

It is thus a feature of at least one embodiment of the invention to vary the level of error handling in portions to provide flexibility between performance and reliability. Portions having lower susceptibility to errors as a function of operating voltage may be deemed more robust than other portions by their storing greater amounts of error handling bits than the other portions.

The transistor memory cells of the different portions may differ according to area of the integrated circuit associated with transistors of each memory cell, with the portions having a greater area being less susceptible to errors as operating voltage decreases than portions having a lesser area.

It is thus a feature of at least one embodiment of the invention to also provide variation in memory architectures by varying the amount of circuit area devoted to each memory cell. Generally, the additional area required for some memory cells to be larger may be more than offset by the ability to make area devoted to other memory cells smaller, which is possible because those latter memory cells need not operate at homogeneously low voltages.

Corresponding individual transistors of the memory cells of different portions may have different sizes of transistor area.

It is thus a feature of at least one embodiment of the invention to provide a simple method of varying the architecture by scaling the size of the memory cells among the different portions.

Another embodiment may provide an integrated circuit comprising a memory structure providing multiple independently controlled groups of memory cells, wherein the groups of memory cells are adapted to store digital data bits and error handling bits for evaluating presence of errors in the digital data bits of the respective group; and a memory controller communicating with the memory structure to: (a) monitor an operating state of the integrated circuit to deduce an operating voltage; and (b) evaluate the error handling bits for presence of errors in the digital data bits of the respective groups when there is a reduction in operating voltage, and not evaluate the error handling bits for presence of errors in the digital data bits of the respective group when there is not a reduction in operating voltage.

Another embodiment may provide an integrated circuit comprising a processor and a memory structure operable to communicate with the processor, wherein the memory structure includes multiple groups of memory cells, wherein the memory cells of the groups differ according to area of the integrated circuit associated with transistors of each memory cell with groups having a greater area being accessible with less latency than groups having a lesser area. The integrated circuit may execute a program stored in a non-transient medium on the processor to: (a) selectively deactivate a group of memory cells with a lesser area of the integrated circuit than another group of memory cells; and (b) prioritize a first thread of execution over a second thread of execution, wherein the first thread of execution is optimized for decreased latency with respect to the second thread of execution, and the second thread of execution is optimized for increased memory capacity with respect to the first thread of execution.

These particular features and advantages may apply to only some embodiments falling within the claims and thus do not define the scope of the invention.

BRIEF DESCRIPTION OF THE FIGURES

Various exemplary embodiments of the subject matter disclosed herein are illustrated in the accompanying drawings in which like reference numerals represent like parts throughout, and in which.

DETAILED DESCRIPTION OF THE PREFERRED EMBODIMENT

Figure 1:
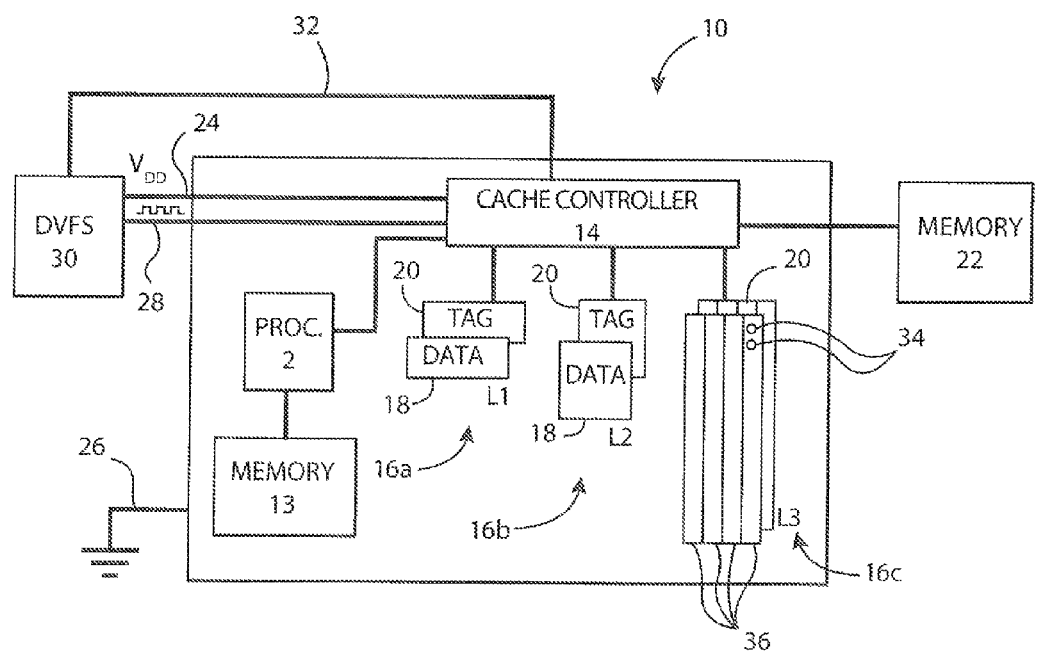
FIG. 1 is a simplified block diagram of a circuit element having a processor, memory controller and multilevel memory structure in accordance with an embodiment of the present invention.

In an exemplar embodiment, referring now to FIG. 1, an integrated circuit element 10, for example, a core of a microprocessor or a freestanding microprocessor, may include a processor element 12 with memory structures such as a PRF, BTB, TLB, ROB, IQ, and LSQ. The processor element 12 may communicate with other memory structures and controllers, such as a scratchpad memory 13 and a cache controller 14 with an L1 cache 16a, an L2 cache 16b, and L3 cache 16c.

Each cache 16 may include a data portion 18 and tag portion 20 as is generally understood in the art, and operating under the control of the cache controller 14, may load data from a main memory 22 together with a tag address identifying the source address of that loaded data in the main memory 22, and may provide that loaded data to the processor element 12 in response to instructions reading the main memory 22 at the particular source address. The caches 16 may further receive modifications of the loaded data from the processor element 12 and may store that data back to the main memory 22 under control of the cache controller 14. In these respects, the cache controller 14 may operate in a conventional manner as is understood in the art.

The integrated circuit element 10 may include input lines for operating voltage 24 and ground 26, these lines together providing power to the circuitry of the integrated circuit element 10. The integrated circuit element 10 may also receive a clock signal 28 permitting synchronous operation of various elements of the integrated circuit element 10 as is understood in the art.

The operating voltage 24 and the clock signal 28 may be provided by a dynamic voltage frequency scaling (DVFS) circuit 30 monitoring operation of the integrated circuit element 10 and possibly other similar elements of a larger integrated circuit, to change the level of the operating voltage 24 and the frequency of the clock signal 28 according to the operating conditions of the integrated circuit 10 and the other similar elements. In particular the DVFS circuit 30 may monitor use of the integrated circuit element 10, for example, with respect to queued instructions or its operating temperature, to raise or lower the operating voltage 24 and the frequency of the clock signal 28 at times when the integrated circuit element 10 is busy or idle or is below or has reached an operating temperature limit, The DVFS circuit 30 may provide for a communication line 32 communicating with the cache controller 14 for indicating changes in the operating voltage 24 or clock signal 28, or the cache controller 14 may receive the operating voltage 24 and clock signal 28 directly and monitor them to deduce changes accordingly.

In accordance with an embodiment, one of the memory structures, such as one of the caches 16, and preferably the largest cache 16c (typically the last-level cache, or LLC), may be constructed with a heterogeneous architecture in which memory cells 34 (for example, each storing a single bit in the cache memory) are grouped into multiple ways 36. Because the LLC cache 16 normally has the greatest number of memory cells of the caches, the invention may provide the greatest impact with this cache, however the invention may also be implemented in other memory structures.

Each way 36 will thus hold multiple memory cells 34 that may be activated and deactivated as a group by the cache controller 14. The deactivation of a way 36 substantially removes all operating power from the memory cells 34 of that way 36 so that they lose state information (lose stored information) and cease consuming substantial power. When a given way 36 is deactivated, addressing for reading and writing of the remaining memory cells 34 of the ways 36 that have not been deactivated continues to operate as normal. Importantly, the grouping of memory cells 34 into ways 36 (defined by the ability to activate or deactivate all memory cells 34 in a way 36 at once) is consistent among different integrated circuit elements 10 to provide deterministic performance behavior for all such integrated circuit elements 10.

Each of the memory cells 34 may be composed of multiple transistors receiving the operating voltage 24 to provide power and biasing to the transistors together with control lines, such as word lines, or bit lines, which are used for transferring data. During normal operation of the memory cells 34 the operating voltage 24 will typically be constant and the word lines and bit lines controlled and read in order to read and write data.

Figure 2:
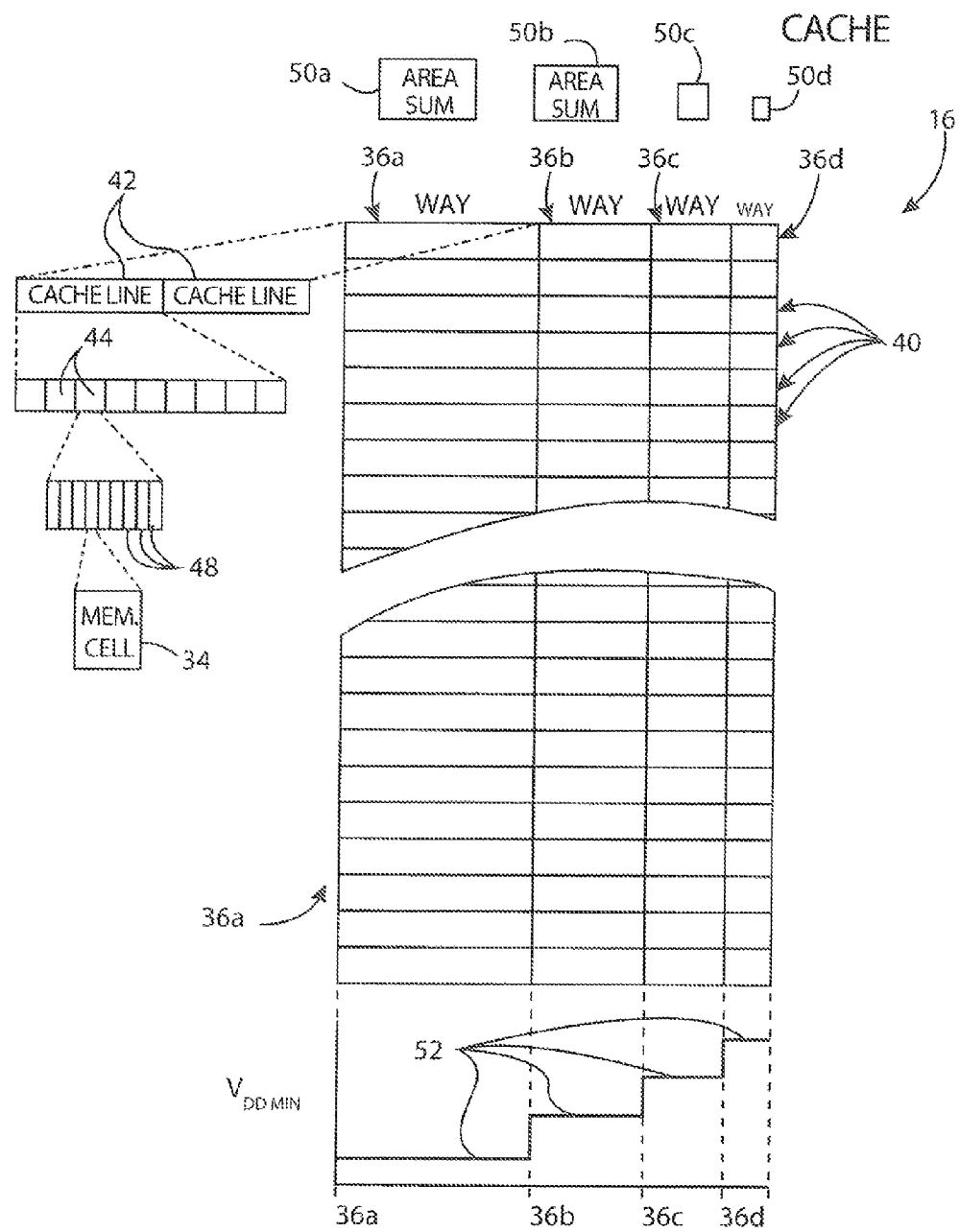
FIG. 2 is a detailed diagram of an exemplar memory structure, a last level cache (LLC) of FIG. 1, divided into portions or ways associated with different minimum operating voltages further showing the hierarchical data structures forming the LLC and variations in the area of the transistors forming memory cells for different ways.

Referring now to FIG. 2, an example LLC cache 16c may provide for four different ways 36a-36d shown as columns spanning multiple rows 40 of memory cells 34. Generally each row 40 within each way 36 will provide storage space for multiple cache lines 42. The cache lines may each be composed of multiple computer words 44 which are in turn composed of multiple digital data bits 48. Each bit will comprise one memory cell 34.

The memory cells 34 in each of the different ways 36 may be associated with different circuits using different amounts of integrated circuit area in the integrated circuit element 10. in the example of FIG. 2, the sum 50a of the areas of the transistors associated with each memory cell 34 for way 36a are larger than a sum 50b of the areas of the transistors associated with each memory cells 34 for way 36b, which in turn are larger than the sum 50c of the areas of the transistors associated with each memory cell 34 for way 36c, which in turn are larger than the sum 50d of the areas of the transistors associated with each memory cell 34 for way 36d.

By changing the areas 50 among the ways 36, the minimum operating voltage 52 ($V_{DDMIN}$) of the memory cells 34 of each of the ways 36a-36d may be varied in a predetermined manner to be lowest for memory cells 34 associated with way 36a and successively higher for memory cells 34 associated, with successive ways of 36b-36d. This increase in minimum operating voltage $V_{DDMIN}$ results from differences in the areas of the transistors of memory cells 34 where larger areas make them less sensitive to mismatches induced by process variations. As noted above, the minimum operating voltage $V_{DDMIN}$ defines how low the operating voltage 24 can be for the memory cells 34 without loss of state information.

Generally the area of the transistor may be any consistent measurement of transistor geometry and will typically be the overlap between the gate and other transistor components for field effect type transistors.

Figure 3:
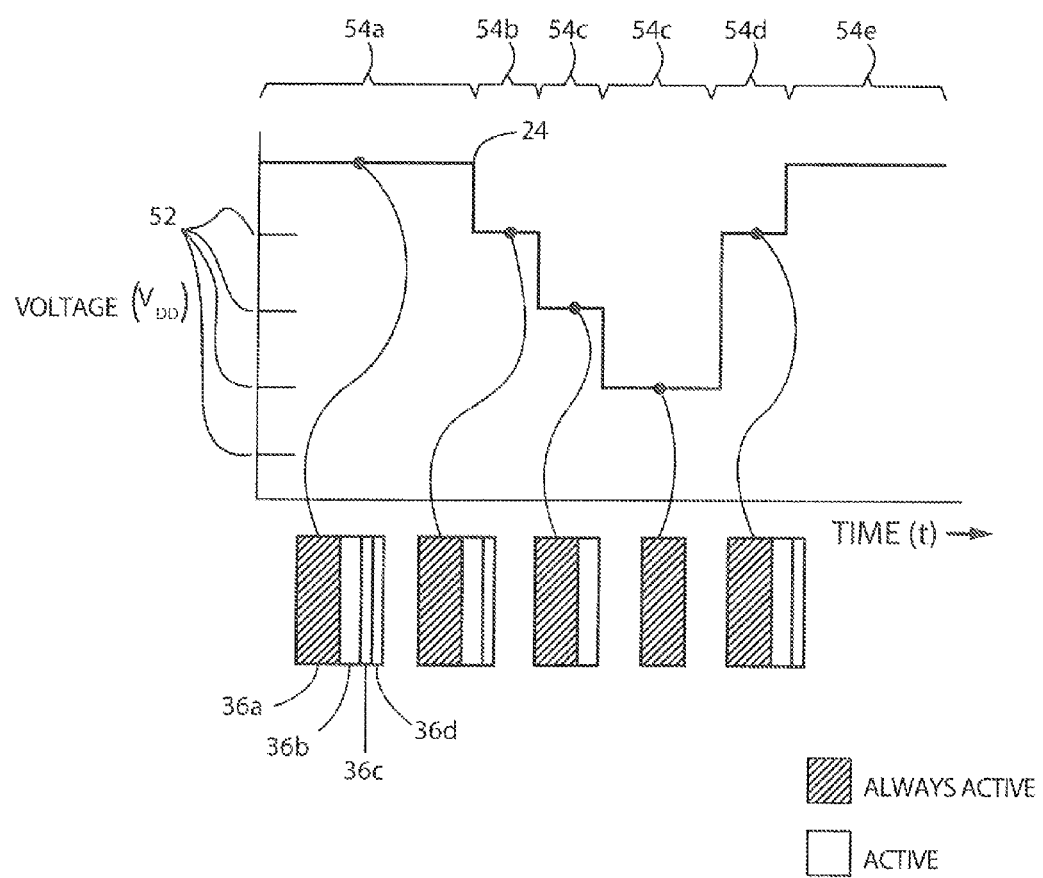
FIG. 3 is a graph of changes in operating voltage showing corresponding changes in memory capacity in accordance with an embodiment of the present invention.

Referring now to FIG. 3, the cache controller 14 may monitor the operating voltage 24 over time to selectively activate and deactivate the different ways 36b-d as a function of the operating voltage 24. Thus, in a first time period 54a where the operating voltage 24 is above the minimum operating voltages 52 for all ways 36a-36d (shown in FIG. 2), all of the ways 36a-36d will be activated for loading and storing of data. As the operating voltage 24 drops progressively below minimum operating voltages 52 for additional individual ways 36 in time periods 54b-54d, those ways 36 whose minimum operative voltage is greater than the current operating voltage 24 will be deactivated starting with way 36d and progressing through way 36b until all but way 36a is deactivated. This process of the activation may be reversed, for example in time periods 54d and 54e as the voltage 24 rises to reactivate individual ways 36.

The present inventors have determined that the performance loss from deactivating ways 36 and thus effectively decreasing the size of the associated cache 16 is substantially offset at lower voltages (where such deactivation will occur) because of lowered frequency of the clock signal 28 of the processor (necessary to match the decreased switching speed of transistors at lower voltages) placing less of a premium on fast access to the main memory 22 and thus permitting a greater number of cache misses with reduced effective penalty for the cache misses.

The use of a heterogeneous cache 16 permits a flexible trade-off between the degree to which the operating voltage 24 may be decreased and loss of performance. The heterogeneous cache 16 even though it employs larger transistors for some ways 36 (e.g. way 36a), may nevertheless reduce total cache area by allowing a reduction in the area of the memory cells 34 for some of the other ways 36 (e.g. way 36d) whose areas would have to be larger if a uniform value $V_{DDMIN}$ were enforced for each way 36. As a result, the cache 16 according to the present invention may be comparable in total area on the integrated circuit element 10 to caches in similar machines having higher minimum voltage.

Figure 4:
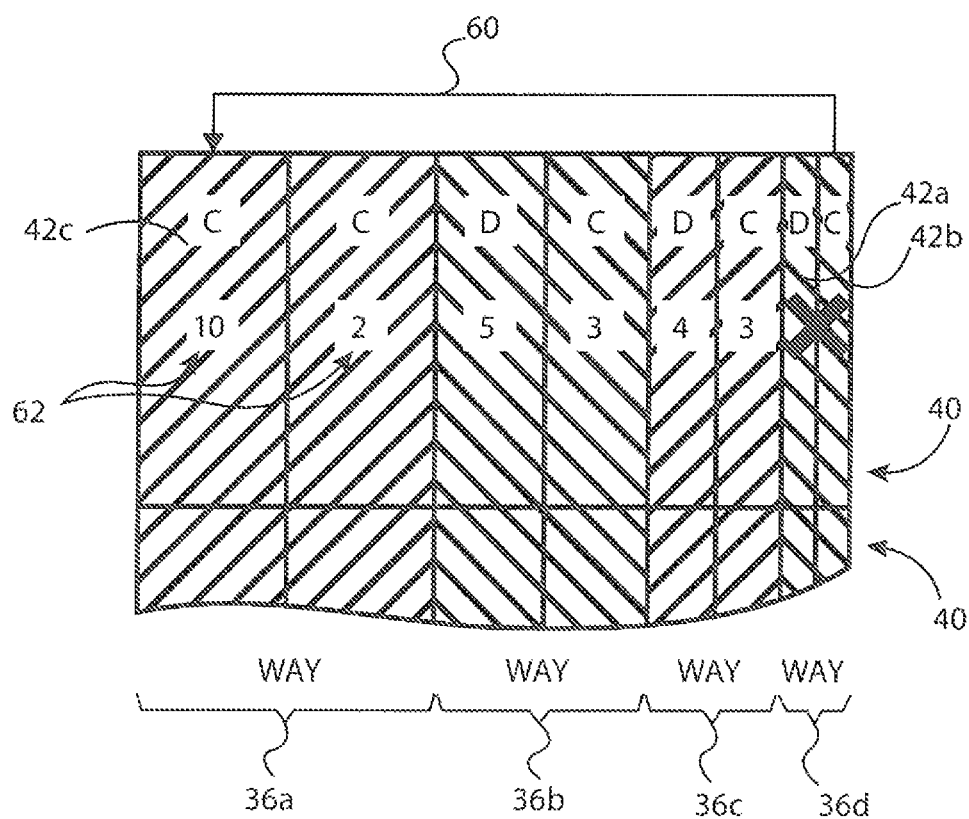
FIG. 4 is a fragmentary diagram of multilevel cache similar to that of FIG. 2 showing intra-cache transfer of dirty cache data.

Referring now to FIG. 4, when the cache controller 14 deactivates a given way 36, for example, indicated by the cross 56 on way 36d, it should evaluate the state of the given cache lines 42a and 42b associated with that way 36d. Cache lines 42b that are "clean" meaning that they have not been modified by the processor element 12 after being loaded from the main memory 22, may be simply deactivated and any state data lost.

Cache lines 42a that are "dirty", meaning that they hold modified data that has been changed by the processor element 12 after having been received from the main memory 22, cannot be deactivated without loss of data that would affect the execution state of the integrated circuit element 10. Accordingly, the cache controller 14 must preserve this data.

In a simplest embodiment, the cache controller 14 may write data of dirty cache lines 42a back to main memory 22 using normal cache control techniques.

Alternatively, the dirty cache lines 42a may be transferred via intra-cache transfer 60 to a clean cache line 42c in a different way 36a that is not being deactivated. In one embodiment, the cache controller 14 may select a cache line 42c to receive the data of the dirty cache line 42a according to how recently data was loaded into the cache line 42e from the main memory 22 indicated schematically by numbers 62 associated with each cache line 42. In this example, the cache controller 14 moves the dirty data from cache line 42b (in a way 36d to be deactivated) into the clean cache line 42c associated with a way 36a that is not being deactivated and that currently has the oldest stored data. This approach greatly reduces the power and resources necessary for transfer of data from the deactivated cache lines 42a.

After deactivation or reactivation of a way 36, the cache controller 14 may compensate for the change in the capacity of the cache 16 by changing stored value indicating cache capacity and available cache lines using techniques well understood in the art in current cache controller technology.

Figure 5:
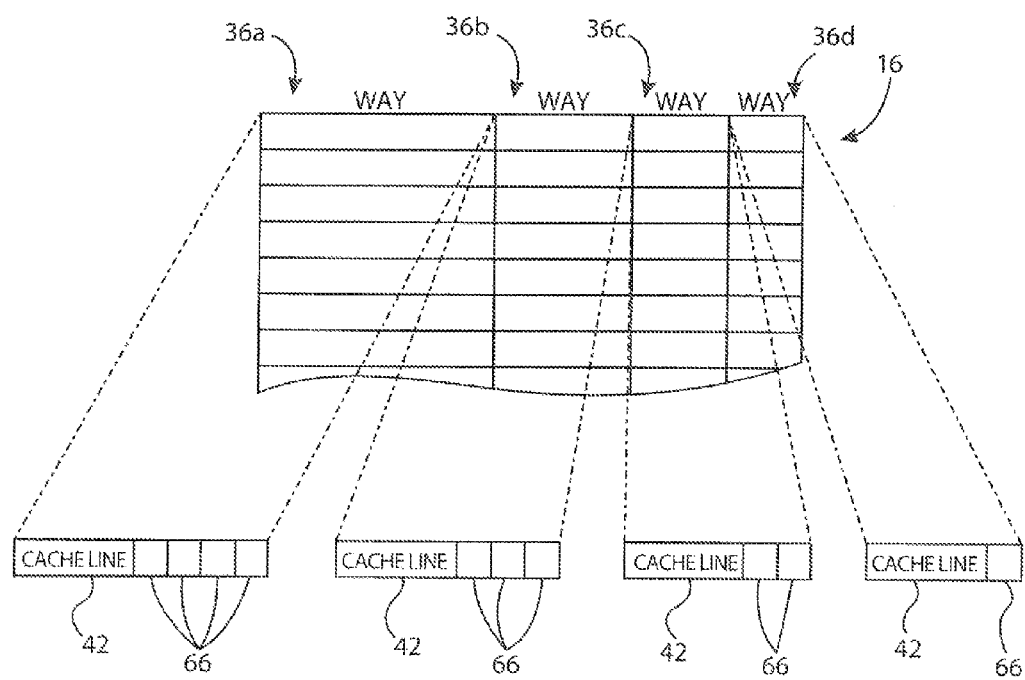
FIG. 5 is a diagram similar to that of FIGS. 2 and 4 showing an alternative cache architecture in which different numbers of error correcting bits are associated with each memory cell of the different ways.

Referring now to FIG. 5, a division of the cache 16 into multiple ways 36 having rankable differences in minimum operating voltages $V_{DDMIN}$ and thus their response to lowering of the operating voltage 24, need not change the physical sizes of the transistors of the memory cells 34 but may instead increase the area of the integrated circuit element 10 devoted to each memory cell 34 by associating additional transistors with a given memory cell 34, wherein the number of additional associated transistors changes according to the particular way 36. Thus, for example, a cache line 42 in way 36a may include memory cells 34 associated with multiple error correcting bits 66 (four shown, in this simplified example) which may serve to correct for errors those memory cells 34 as voltage is reduced providing the corresponding cache line with a lower value of $V_{DDMIN}$. The memory of the error correcting bits 66 and associated circuitry contribute to the effective area of the memory cells 34 according to the area of the error correcting circuitry divided by the number of memory cells 34 for which it provides error correction. The error correcting bits 66 thus effectively increase the area of the integrated circuit element 10 supporting each memory cell to provide greater robustness against low voltage memory loss.

Continuing with this example, cache line 42 for way 36b may be associated with fewer (e.g. three) error correcting bits and cache line 42 associated with way 36c may be associated with two error correcting bits 66 and cache line 42 associated with way 36d may be associated with one error correcting bit 66, it will be understood that these numbers of bits are shown for explanation only and that the invention is not bound to a particular number of error correcting or detecting bits provided that a difference in the memory cells 34 for different ways 36 in response to lowering voltage 24 may be affected. It will also be understood that various error handling techniques may be provided, alone or in combination, such as error correcting codes (FCC), cyclic redundancy checks (CRC), checksums, parity, repetition, redundancy and/or cryptographic hash functions.

Figure 6:
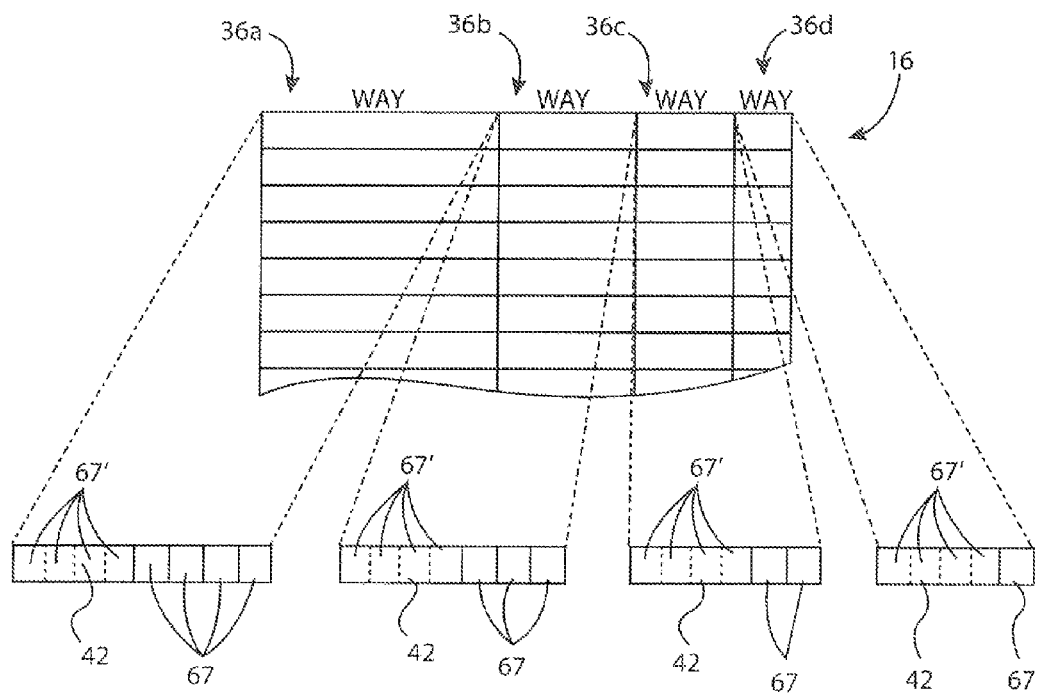
FIG. 6 is a figure similar to that of FIG. 5 showing alternative cache architecture in which different numbers of redundant memory cells are provided for each memory cell of the different ways.

Referring now to FIG. 6, in an alternative embodiment, different numbers of redundant memory components 67 may be associated with the cache lines 42 of each way 36. The redundant memory components 67 may be single bits 48 of the cache line 42 or individual computer words 44 of the cache line 42 or even individual memory cells 34 or transistors of a multi transistor memory cell 34 representing a single bit 48. Importantly, the redundant memory components 67 can be substituted or rewired for corresponding components 67' of the cache line 42 (by setting fuses or the like).

During manufacture, the cache lines 42 of each way 36 are tested to the desired voltage (e.g., lower voltages for way 36a than for way 36d) and components 67' of the tested cache lines 42 that cannot perform at the desired voltage are identified. These underperforming components 67' are then replaced by particular redundant components 67 that have been identified as performing at the desired voltage. Generally, components 67 that will perform at lower relative voltages under normal manufacturing variations will be less common than components 67 that will perform at higher relative voltages. Further, underperforming components 67' will be more common at lower voltages. Accordingly access to more components 67 is provided to the ways 36 that must operate at lower voltages.

Thus, in way 36a, for example, one component 67 may be replaced by any of four other redundant components 67, whereas the components 67' in the ways 36b, 36c, and 36d, may be replaced by only three two and one redundant components 67 respectively. In this case, heterogeneous structure is a result of the associations of different numbers of redundant components 67 with the cache lines 42 of each way 36.

In one embodiment, the redundant components 67 individually may be of equal size in each of the ways 36a-36d and of equal size to the replaced components 67. In different embodiments, however, the redundant components 67 may be slightly Larger or smaller than the components they replace to increase or decrease the chance that they may serve as replacement components for a given voltage. In addition, the area of the individual redundant components 67 may be varied according to the ways 36 in some embodiments. In one embodiment, the redundant components 67 may be selected by any of the ways 36 from a common pool shared by all of the ways 36. The redundant components 67 may then be characterized with respect to voltage and those operating at the lowest voltage levels allocated as needed to the ways 36 operating at the lowest voltage.

It will be understood that, while certain embodiments contemplate that multiple memory cells 34 may be activated and deactivated by the cache controller 14 as a group defined by ways 36 which are represented by columns, the cache controller 14 may alternatively activate and deactivate memory cells 34 according to rows. As before, deactivation of a row substantially removes all operating power from the memory cells 34 of that way 36 so that they lose state information (lose stored information) and cease consuming substantial power.

Figure 7:
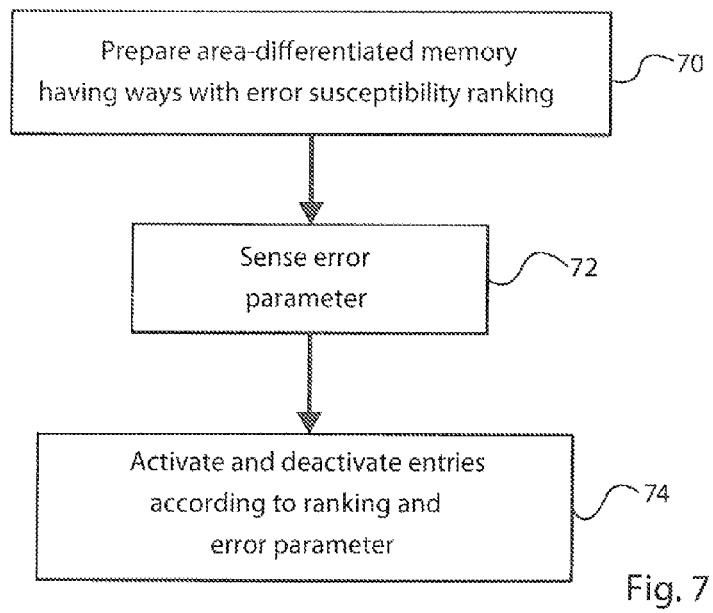
FIG. 7 is a flowchart of a method activating and deactivating entries in accordance with an embodiment of the present invention.

Referring now to FIG. 7, embodiments may follows a methodology that begins with the preparation of area differentiated cache structures with error susceptibility ranking of the different portions of the area differentiated cache structure as indicated by process block 70. This cache structure may be produced by any of the techniques described with respect to FIGS. 2, 5 and 6 in which each way 36 is associated with a minimum operating voltage threshold $V_{DDMIN}$ of the operating voltage 24. Different portions of the cache structure having different rankings may be individually activated or deactivated, for example, using a common control line for the portion.

At process block 72, an error parameter is sensed, for example the value of the operating voltage 24, the frequency of the clock signal 28, temperature, detected errors or other proxies for reduced voltage which will be used to control the activation and deactivation of the portions of the cache structure.

At process block 74, based on the sensed error parameter, different ways 36 may be switched in or out of the cache 16 according to the ranking and based on the sensed error parameter.

While the above described embodiments contemplates that multiple memory cells 34 may be activated and deactivated by the cache controller 14 as a group defined by ways 36 which are represented by columns it will be understood that the cache controller 14 may alternatively activate and deactivate memory cells 34 according to rows. As before, deactivation of a row substantially removes all operating power from the memory cells 34 of that way 36 so that they lose state information (lose stored information) and cease consuming substantial power.

Figure 8:
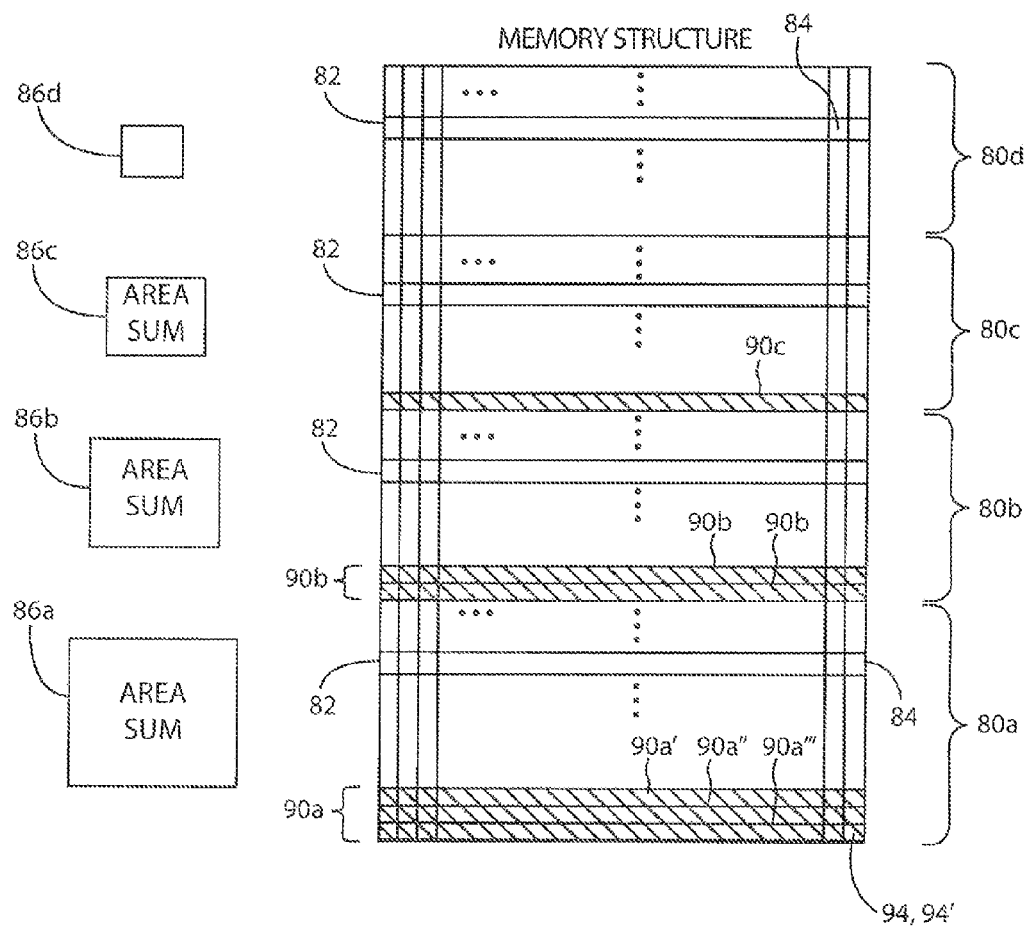
FIG. 8 is a detailed diagram of another memory structure, such as a scratchpad memory, PRF, BTB, TLB, ROB, IQ, or LSQ, divided into portions or entries associated with different minimum operating voltages further showing the hierarchical data structures forming the memory structure and possible variations in the area of the transistors forming memory cells for different entries.

Referring now to FIG. 8, another of the memory structures, such as a scratchpad memory, PRF, BTB, TLB, ROB, IQ, or LSQ, may provide, for example, four different portions, groups or entries 80a-80d shown as multiple rows 82 of memory cells 84. Generally each row 82 within each portion 80 will provide storage space for multiple data blocks. The data blocks may each be composed of multiple computer words which are in turn composed of multiple digital data bits. Each bit will comprise one memory cell 84.

The memory cells 84 in each of the different portions 80 may be associated with different circuits using different amounts of integrated circuit area in the integrated circuit element 10. Referring again to FIG. 2, the sum 86a of the areas of the transistors associated with each memory cell 84 for portion 80a will be larger than a sum 86b of the areas of the transistors associated with each memory cells 84 for portion 80b, which in turn will be larger than the sum 86c of the areas of the transistors associated with each memory cell 84 for portion 80c, which in turn will be larger than the sum 86d of the areas of the transistors associated with each memory cell 84 for portion 80d.

By changing the areas 86 among the portions 80, the minimum operating voltage 52 ($V_{DDMIN}$) of the memory cells 84 of each of the portions 80a-80d may be varied in a predetermined manner to be lowest for memory cells 84 associated with portion 80a and successively higher for memory cells 84 associated with successive portions of 80b-80d. This increase in minimum operating voltage $V_{DDMIN}$ results from differences in the areas of the transistors of memory cells 84 where larger areas make them less sensitive to mismatches induced by process variations. As noted above, the minimum operating voltage $V_{DDMIN}$ defines how low the operating voltage 24 can be for the memory cells 84 without loss of state information.

Generally the area of the transistor may be any consistent measurement of transistor geometry and will typically be the overlap between the gate and other transistor components for field effect type transistors.

However, a division of the memory structure into multiple portions 80 having rankable differences in minimum operating voltages $V_{DDMIN}$ and thus their response to lowering of the operating voltage 24, need not change the physical sizes of the transistors of the memory cells 84 but may instead increase the area of the integrated circuit element 10 devoted to each memory cell 84 by associating additional transistors with a given memory cell 84, wherein the number of additional associated transistors changes according to the particular entry 80. Thus, for example, a portion 80a may include memory cells associated with multiple error handling bits 94 in error handling rows 90a (three shown for portions 80a, in this simplified example) which may serve to correct for errors those memory cells 84 in rows 82 as voltage is reduced providing the corresponding rows with a lower value of $V_{DDMIN}$. The memory of the error handling rows 90 and associated circuitry contribute to the effective area of the memory cells 84 according to the area of the error handling circuitry divided by the number of memory cells 84 for which it provides error correction. The error handling bits 94 thus effectively increase the area of the integrated circuit element 10 supporting each memory cell to provide greater robustness against low voltage memory loss.

Continuing with this example, portion 80b may be associated with fewer (e.g. two) error handling rows 90b, portion 80c may be associated with even fewer (e.g. one) error handling rows 90c, and portion 80d may be associated with no error correcting rows. It will be understood that these numbers of rows and bits are shown for explanation only and that the invention is not bound to a particular number of error correcting or detecting bits provided that a difference in the memory cells 84 for different portions 80 in response to lowering voltage 24 may be affected.

In an alternative embodiment, similar to that described above with respect to FIG. 6, different numbers of redundant memory components 94' may be associated with the rows 82 of each portion 80. The redundant memory components 94 may be single bits of the error correcting rows 90. Importantly, the redundant memory components 94' can be substituted or rewired for corresponding components 94' of the rows 82 (such as by setting fuses or the like).

Accordingly, the error handling bits 94 may be evaluated by a memory controller or the processor for determining the presence (or absence) of errors in the digital data bits or memory cells 84 of the respective portion using any of the techniques described above (e.g., ECC bits, CRC, checksum, parity, repetition, redundancy (such as via backup memory bits) and/or hash).

Figure 9:
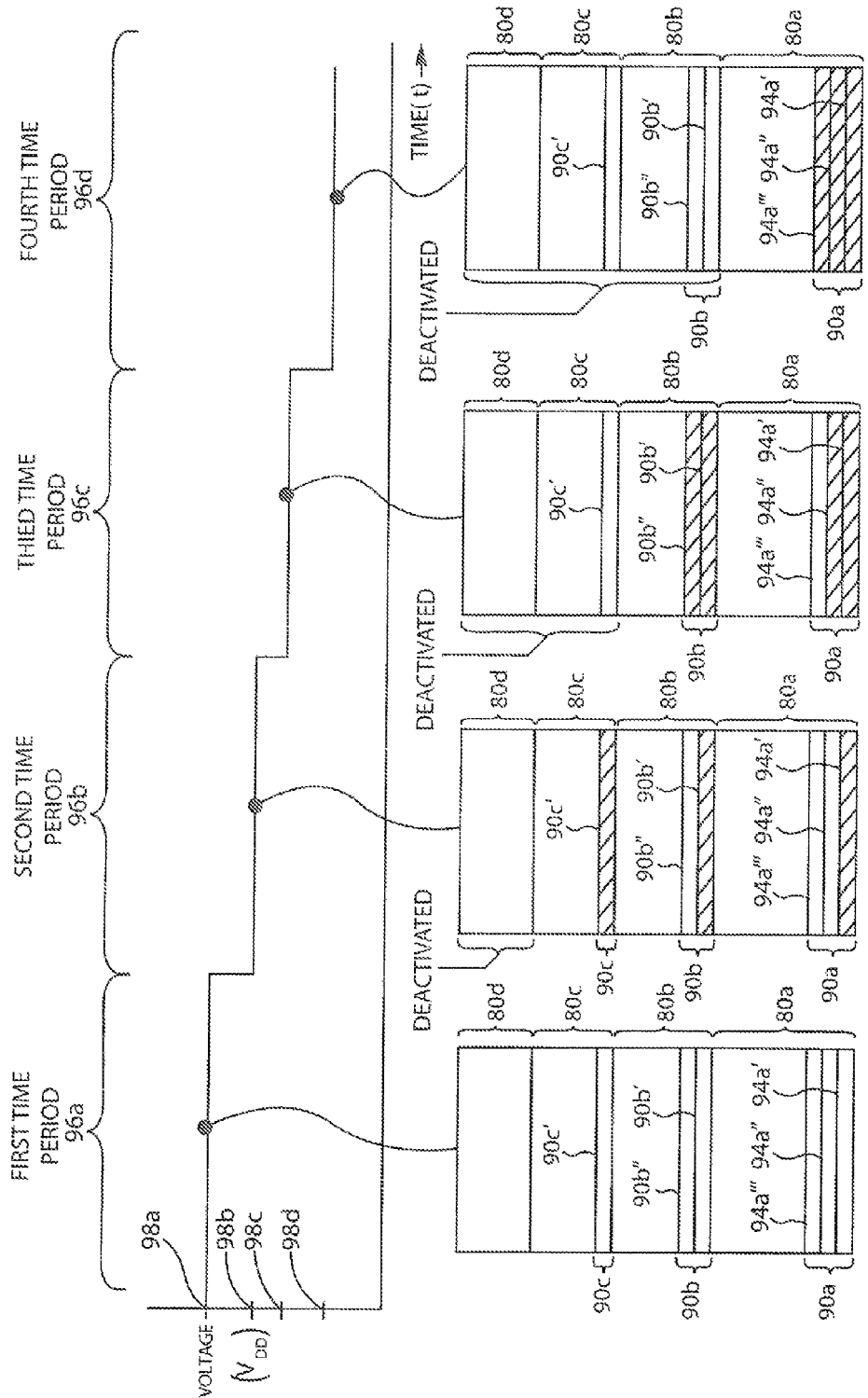
FIG. 9 is a graph of changes in operating voltage showing corresponding changes in utilization of error handling bits in a heterogeneous memory structure utilization in accordance with an embodiment of the present invention.

Referring now to FIG. 9, a memory controller may monitor the operating voltage 24 over time to selectively evaluate or not evaluate error handling bits based on changes in the operating voltage 24. In a first time period 96a where the operating voltage 24 is operating at a first level 98a, above the minimum operating voltages 98b-d for all portions 80a-d, all of the portions 80a-d will be activated for loading and storing of data. However, the error handling bits 94 in the error handling rows 90a-c will not be evaluated for determining the presence of errors in the respective digital data bits. This advantageously allows the memory structure to operate with the least latency and highest performance by not accessing and/or evaluating the error handling bits 94 in the error handling rows 90a-c while the operating voltage is in a state which ensures the least susceptibility to errors.

Next, in a second time period 96b where the operating voltage 24 is at a second level 98b, below the first level 98a (shown in FIG. 9), the portion 80d may be deactivated while the portions 80a-c may still be reliably activated for loading and storing of data. This may be achieved by allowing the error handling bits 94 in the error handling rows 90a-c to now be evaluated for the presence of errors. Although some performance may be impacted by evaluation of the error handling rows 90a-c, the portions 80a-c may remain operational at the reduced operating voltage at the second level 98b.

However, not all of the error handling rows 90a-c need to be activated. For example, in portions 80a and 80b, only a first part of the error handling rows 90a' and 90b' are activated, respectively.

Next, in a third time period 96c where the operating voltage 24 is at a third level 98c, below the first and second levels 98a-b (shown in FIG. 8), the portion 80c, whose minimum operative voltage is greater than the current operating voltage 24, will also be deactivated. However, the portions 80a-b may enable more error handling rows 90a" and 90b" and thereby continue to be active for loading and storing of data. Once again, some performance may be impacted by evaluation of the error handling rows 90a-b. However, portions 80a-b may advantageously remain operational at the reduced operating voltage at the third level 98c.

Next, in a fourth time period 96d where the operating voltage 24 is at a fourth level 98d, below the first, second and third levels 98a-c, the portions 80b-d, whose minimum operative voltages are greater than the current operating voltage 24, will be deactivated. However, the portion 80a may enable more error handling rows 90a''' and thereby continue to be active for loading and storing of data.

The example described above with respect to FIG. 8 may be reversed and/or occur in various orders and at varying times.

Figure 10:
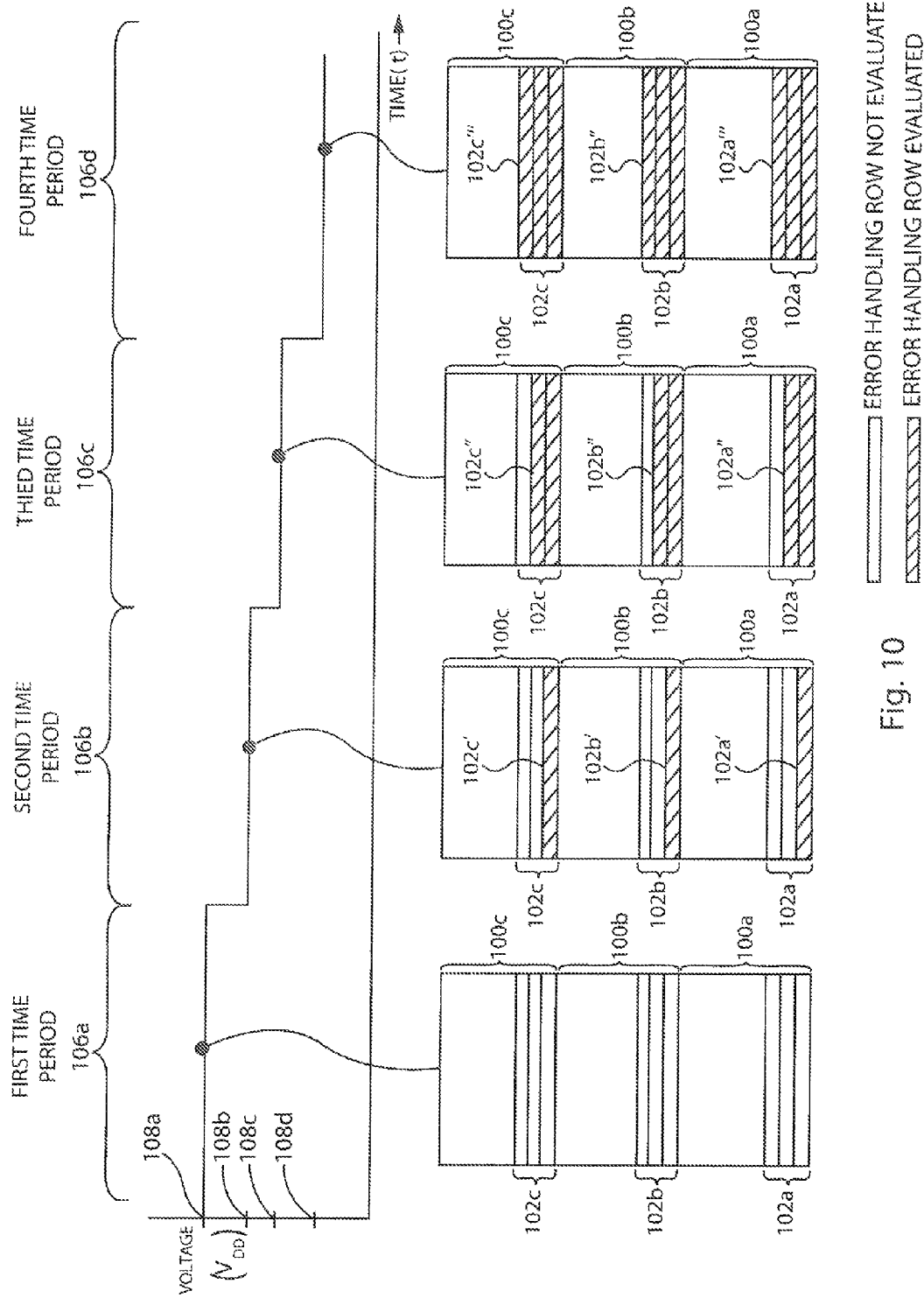
FIG. 10 is an alternative graph of changes in operating voltage showing corresponding changes in utilization of error handling bits in memory structure utilization in accordance with an embodiment of the present invention.

Referring now to FIG. 10, in another embodiment, a memory controller may monitor the operating voltage 24 over time to selectively evaluate or not evaluate error handling bits based on changes in the operating voltage 24. Here, different portions 100a-c (three shown for simplicity) in a memory structure each store digital data bits, in addition to error handling bits in error handling rows 102a-c, in each respective portion 100. The error handling bits in error handling rows 102a-c may be evaluated by the memory controller or the processor for determining presence (or absence) of errors in the cache data of the respective way using any of the techniques described above (e.g., ECC bits, CRC, checksum, parity, repetition, redundancy (such as via backup memory bits) and/or hash).

In a first time period 106a where the operating voltage 24 is operating at a first level 108a, above the minimum operating voltages 108b-d for all portions 100a-c, all of the portions 100a-c will be activated for loading and storing of data. However, the error handling rows 102a-c will not be evaluated for determining the presence of errors in the cache data. This advantageously allows the memory structure to operate with the least latency and highest performance by not accessing and/or evaluating the error handling data 94a-c while the operating voltage is in a state which ensures the least susceptibility to errors.

Next, in a second time period 106b where the operating voltage 24 is at a second level 108b, below the first level 108a, all of the portions 100a-c may still be reliably activated for loading and storing of data. This may be achieved by allowing the error handling rows 102a-c to now be evaluated for the presence of errors, and in particular, parts of the error handling rows 102a', 102b' and 102c'. Although some performance may now be impacted by evaluation of the error handling rows 102a-c, all of the portions 100a-c may remain operational at the reduced operating voltage at the second level 98b.

Next, in a third time period 106c where the operating voltage 24 is at a third level 108c, below the first and second levels 108a-b, all of the portions 100a-c may still be activated for loading and storing of data. This may be achieved by enabling more error handling rows 102a", 102b" and 102c".

Next, in a fourth time period 106d where the operating voltage 24 is at a fourth level 108d, below the first, second and third levels 108a-c, all of the portions 100a-c may still be activated for loading and storing of data. This may be achieved by again enabling more error handling data 102a''', 102b''' and 102c'''.

The example described above with respect to FIG. 9 may also be reversed and/or occur in various orders and at varying times.

It will be understood that the occurrence of errors, the detection of errors and/or the handling of errors need not be absolute, and that in alternative embodiments, an acceptable level of errors, and a resulting level of error handling, may be estimated and implemented. It will also be understood that other embodiments may advantageously combine one or more of the techniques as described above. For example, the memory structure may also be implemented in which the transistor memory cells of different portions differ according to area of an integrated circuit associated with transistors of each memory cell, and individual transistors of the memory cells of different portions have different sizes of transistor area. Such variations of techniques as described above will be understood as being within the scope of the invention.

Figure 11:
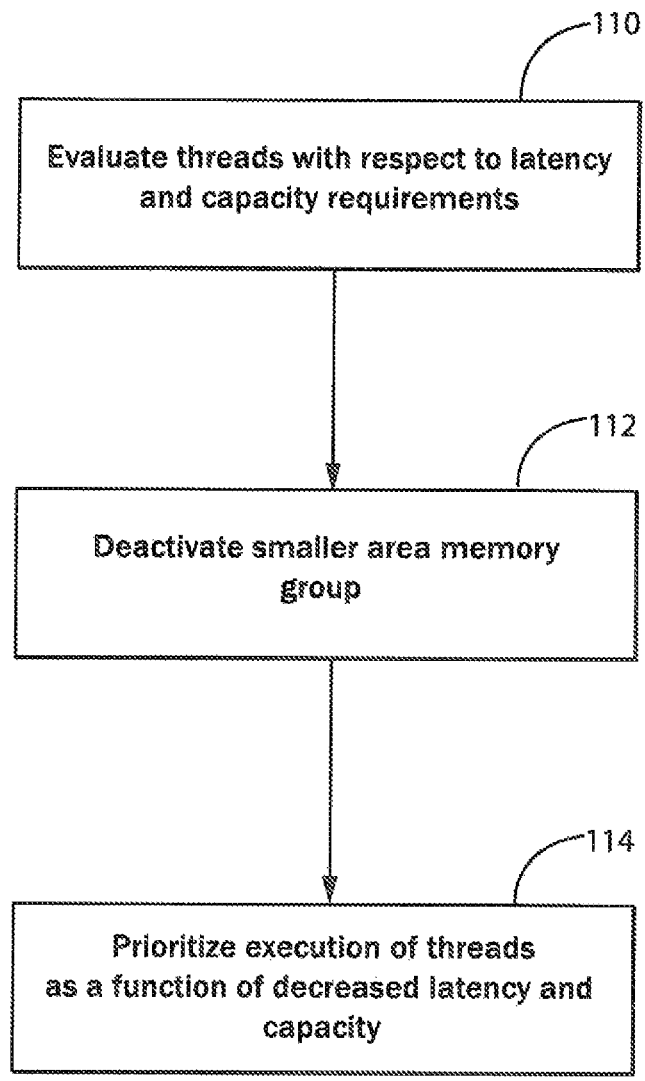
FIG. 11 is a flowchart of an algorithm for prioritizing workloads or threads in accordance with an embodiment of the present invention.

Referring now to FIG. 11, a flowchart of an algorithm for prioritizing workloads or threads in accordance with an embodiment of the present invention is provided. An exemplar integrated circuit may comprise a processor and a memory structure operable to communicate with the processor, wherein the memory structure includes multiple groups of memory cells, wherein the memory cells of the groups differ according to area of the integrated circuit associated with transistors of each memory cell with groups having a greater area being accessible with less latency than groups having a lesser area. In process block 110, the integrated circuit may execute to evaluate multiple threads of execution with respect to preferred access times or latencies and preferred resources or capacity requirements. It will be appreciated that certain threads of execution may improve greater with lower latency than other threads, and may also require fewer resources or less capacity, such as the number of bits in a memory structure. Such threads may be evaluated and ranked in this manner.

In process block 112, the integrated circuit may execute to selectively deactivate a group of memory cells with a lesser area of the integrated circuit than another group of memory cells. This may result, for example, in power savings by deactivating certain groups, leaving the greater area groups active and the lesser area groups inactive.

In process block 114, the integrated circuit may execute to prioritize execution of threads as a function of decreased latency and capacity as ranked above with respect to process block 110. For example, a first thread of execution may be prioritized over a second thread of execution and executed accordingly, wherein the first thread of execution is optimized for decreased latency with respect to the second thread of execution, and the second thread of execution is optimized for increased memory capacity with respect to the first thread of execution.

Figure 12:
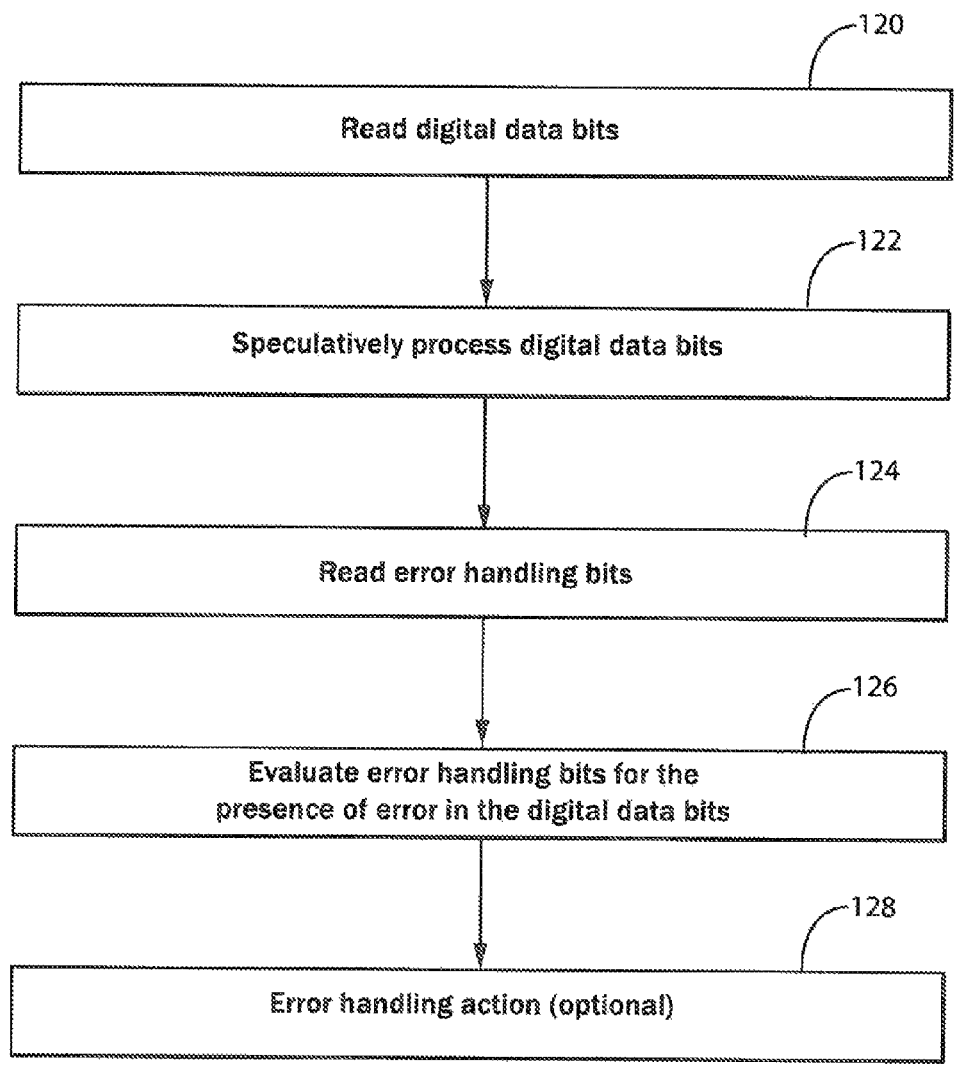
FIG. 12 is a flowchart of an algorithm tier speculatively processing digital data bits in accordance with an embodiment of the present invention.

Referring now to FIG. 12, a flowchart of an algorithm for speculatively processing digital data bits in accordance with an embodiment of the present invention is provided. An exemplar integrated circuit may comprise a processor and a memory structure operable to communicate with the processor, wherein a group of memory cells is adapted to store digital data bits and error handling bits for evaluating the presence of errors in the digital data bits of the respective group. In process block 120, the integrated circuit may execute to read digital data bits from a group of memory cells in the memory structure.

Next, in process block 122, the digital data bits stored in the respective group may be speculatively executed or otherwise processed. In process block 124, the integrated circuit may execute to read error handling bits from the same respective group of memory cells in the memory structure. In process block 126, the error handling bits may be evaluated for the presence of errors in the digital data bits in the respective group. Finally, if an error is detected, in process block 128, an optional error handling action may take place.

Figure 13:
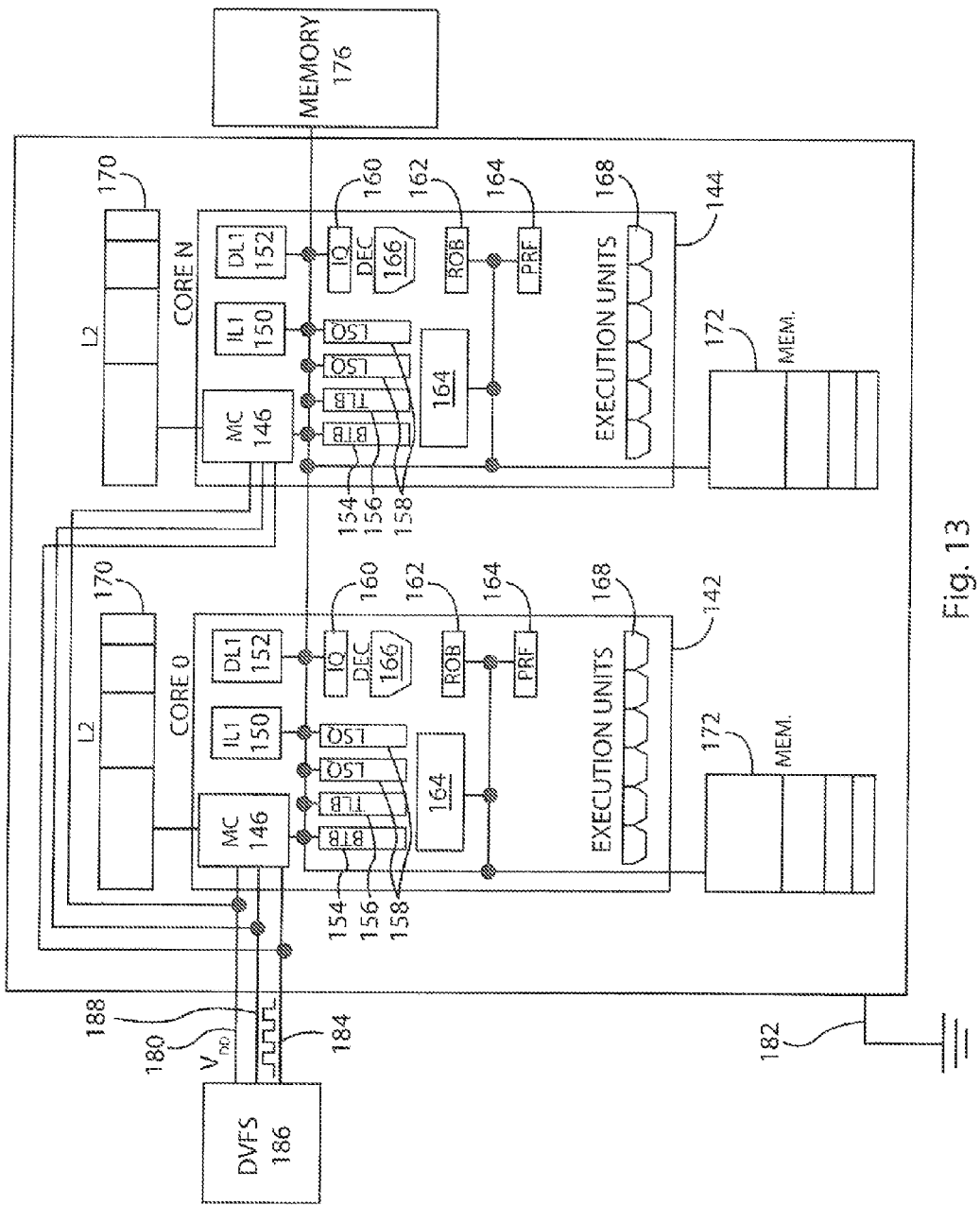
FIG. 13 is an alternative block diagram of a computer architecture employing various types of memory structures, including multilevel caches, scratchpad memory, PRF, BTB, TLB, ROB, IQ, and LSQ, employing techniques in accordance with an embodiment of the present invention.

Referring now to FIG. 13, an alternative block diagram of a computer architecture employing various types of memory structures is provided in accordance with an embodiment of the present invention. A multi-core integrated circuit element 140 comprises a first core 142 and a second core 144. Each core includes a memory controller 146 in communication with the various memory structures of each respective core and optionally each other. The various memory structures of each respective core in communication with the memory controller may include, for example, a Level 1 Instruction (IL1) cache 150, a Level 1 Data (DL1) cache 152, BTB 154, TLB 156, LSQ 158, IQ 160, ROB 162 and PRF 164. Each of these various memory structures may be divided into portions and sized in accordance with the techniques described above with respect to FIGS. 1-12. Each core also includes various decoders 166, execution units 168 and other circuitry as understood in the art.

In addition, the memory controller 146 may also be in communication with other memory structures on the integrated circuit element 140, such as a Level 2 (L2) cache 170, which may comprise SRAM cells and which may be a LLC, and a scratchpad memory 172, which may comprise DRAM cells. These additional memory structures on the integrated circuit element 140 may also be divided into portions and sized in accordance with the techniques described above with respect to FIGS. 1-12. The integrated circuit element 140 may load data from a main memory 176.

The integrated circuit element 10 may include input lines for operating voltage 180 and ground 182, these lines together providing power to the circuitry of the integrated circuit element 140. The integrated circuit element 140 may also receive a clock signal 184 permitting synchronous operation of various elements of the integrated circuit element 140 as is understood in the art.

The operating voltage 180 and the clock signal 184 may be provided by a dynamic voltage frequency scaling (DVFS) circuit 186 monitoring operation of the integrated circuit element 140 and possibly other similar elements of a larger integrated circuit, to change the level of the operating voltage 180 and the frequency of the clock signal 184 according to the operating conditions of the integrated, circuit 140 and the other similar elements. In particular the DVFS circuit 186 may monitor use of the integrated circuit element 140, for example, with respect to queued instructions or its operating temperature, to raise or lower the operating voltage 180 and the frequency of the clock signal 184 at times when one or more cores of the integrated circuit element 140 are busy or idle or is below or has reached an operating temperature limit. The DVFS circuit 186 may provide for a communication line 188 communicating with the memory controllers 146 of the respective cores 142 and 144 for indicating changes in the operating voltage 180 or clock signal 184, or the memory controllers 146 may receive the operating voltage 180 and clock signal 184 directly and monitor them to deduce changes accordingly.

Accordingly, at least one of the memory structures, such as IL1 cache 150, DL1 cache 152, BTB 154, TLB 156, LSQ 158, IQ 160, ROB 162, PRF 164, L2 cache 170 and/or scratchpad memory 172, may be constructed with a heterogeneous architecture in which memory cells (for example, each storing a single bit memory) are grouped into multiple portions. Using the techniques described above with respect to FIGS. 1-12, negative performance impacts for evaluating error handling bits, such as additional access latencies, are avoided when the memory operates at higher voltage (and frequency) and memory errors are less likely. In addition, increased latencies due to evaluating error handling bits, may be hidden by reading digital data bits from the memory structures speculatively and assuming no errors. Also, certain portions of the memory structures may have larger cells, and therefore larger areas, than other portions, which may provide not only higher reliability at low operating voltages, but also faster operation with reduced latency. As a result, for workloads or threads of execution not requiring as much resources or capacity, but preferring reduced access latency or cycle times at high voltage/frequency, the larger portions can be activated while the smaller portions are deactivated to improve performance.

Certain terminology is used herein for purposes of reference only, and thus is not intended to be limiting. For example, terms such as "upper", "lower", "above", and "below" refer to directions in the drawings to which reference is made. Terms such as "front" "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a processor" should be understood to include not only a stand-alone processor, but a processing core that may be one portion of a multicore processor. The term "processor" should be flexibly interpreted to include a central processing unit and a cache structure or the central processing unit alone as context will require. Furthermore, references to memory, unless otherwise specified, can include one or more processor-readable and accessible memory elements and/or components that can be internal to the processor-controlled device, external to the processor-controlled device, and can be accessed via a wired or wireless network.

The depiction of the circuit elements, for example, the caches, should be understood to be a schematic and representing the logical construction of the elements rather than their physical layout.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications are hereby incorporated herein by reference in their entireties.

What is claimed is:

1. A memory system comprising a series of addressable transistor memory cells holding digital data when powered by an operating voltage, wherein
the addressable transistor memory cells are grouped into at least two portions, each portion adapted for storing digital data bits and error handling bits for evaluating presence of errors in the digital data bits of the respective portion, and
wherein the error handling bits are evaluated for presence of errors in the digital data bits of a respective portion when there is a reduction in operating voltage, and the error handling bits are not evaluated for presence of errors in the digital data bits in the respective portion when there is not a reduction in operating voltage.

2. The memory system of claim 1, wherein the portions provide different architectures having different predetermined susceptibility to errors as a function of operating voltage, whereby individual portions may be deactivated or activated with changes in operating voltage according to the predetermined susceptibility to errors as a function of operating voltage.

3. The memory system of claim 2, wherein portions having lower susceptibility to errors as a function of operating voltage store greater amounts of error handling bits than portions having higher susceptibility to errors as a function of operating voltage.

4. The memory system of claim 2, wherein the transistor memory cells of each portion differ according to area of an integrated circuit associated with transistors of each memory cell with the portions having a greater area being less susceptible to errors as operating voltage decreases than memory portions having lesser area.

5. The memory system of claim 4, wherein corresponding individual transistors of the memory cells of each portion have different sizes of transistor area.

6. The memory system of claim 5, wherein portions having greater sizes of transistor area are accessible with less latency than portions having lesser sizes of transistor area.

7. The memory system of claim 1, wherein the error handling bits comprise error correcting code bits.

8. The memory system of claim 1, wherein the error handling bits comprise redundant memory bits.

9. The memory system of claim 1, wherein the memory cells are static random access memory cells.

10. An integrated circuit comprising:
a memory structure providing multiple independently controlled groups of memory cells, wherein the groups of memory cells are adapted to store digital data bits and error handling bits for evaluating presence of errors in the digital data bits of the respective group; and
a memory controller communicating with the memory structure to:
(a) monitor an operating state of the integrated circuit to determine an operating voltage; and
(b) evaluate the error handling bits for presence of errors in the digital data bits of a respective group when there is a reduction in operating voltage, and not evaluate the error handling bits for presence of errors in the digital data bits of the respective group when there is not a reduction in operating voltage.

11. The integrated circuit of claim 10, wherein the groups of memory cells have predetermined differing susceptibility to errors as a function of operating voltage, and wherein the memory controller communicates with the memory structure to selectively activate and deactivate groups of memory cells as a function of operating voltage according to the predetermined differing susceptibility to errors as a function of operating voltage.

12. The integrated circuit of claim 11, wherein groups of memory cells having lower susceptibility to errors as a function of operating voltage store greater amounts of error handling bits than groups of memory cells having higher susceptibility to errors as a function of operating voltage.

13. The integrated circuit of claim 11, wherein the memory cells of the groups differ according to area of the integrated circuit associated with transistors of each memory cell with the groups having a greater area being less susceptible to errors as operating voltage decreases then memory cells of groups having lesser area.

14. The integrated circuit of claim 13, wherein corresponding individual transistors of the memory cells of the groups have different sizes of transistor area.

15. The integrated circuit of claim 10, wherein the error handling bits are at least one of error correcting code bits and redundant memory bits.

16. The integrated circuit of claim 10, wherein the memory structure is at least one of a scratchpad random access memory, a physical register file, an instruction queue and a load/store queue.

17. An integrated circuit comprising a processor and a memory structure operable to communicate with the processor, wherein the memory structure includes multiple independently controlled groups of memory cells, wherein the groups of memory cells differ according to amounts of integrated circuit area associated with transistors of each memory cell with groups having a greater area being accessible with less latency than groups having a lesser area, the integrated circuit executing a program stored in a non-transient medium on the processor to:
(a) selectively deactivate a group of memory cells with a lesser amount of area than another group of memory cells with greater amount of area, wherein the group of memory cells with the greater amount of area provides faster operation than the group of memory cells with the lesser amount of area; and
(b) prioritize a first thread of the program for execution over a second thread of the program for execution, wherein the second thread of the program for execution is determined to require less memory than the first thread of the program for execution.

18. The integrated circuit of claim 17, wherein each group of memory cells is adapted to store digital data bits and error handling bits for evaluating presence of errors in the digital data bits of the respective group, and wherein the integrated circuit executes to process digital data bits stored in a first group of memory cells, then subsequently evaluate error handling bits for presence of errors in the digital data bits of the first group.

19. The integrated circuit of claim 17, wherein the groups of memory cells provide different architectures having different predetermined susceptibility to errors as a function of operating voltage, whereby individual groups of memory cells may be deactivated or activated with changes in operating voltage according to the predetermined susceptibility to errors as a function of operating voltage.

20. The integrated circuit of claim 19, wherein portions having lower susceptibility to errors as a function of operating voltage store greater amounts of error handling bits than portions having higher susceptibility to errors as a function of operating voltage.

* * * * *